(12) United States Patent
Murakami

(10) Patent No.: US 7,245,153 B2
(45) Date of Patent: Jul. 17, 2007

(54) LEVEL SHIFT CIRCUIT HAVING TIMING ADJUSTMENT CIRCUIT FOR MAINTAINING DUTY RATIO

(75) Inventor: Hideaki Murakami, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 109 days.

(21) Appl. No.: 11/234,005

(22) Filed: Sep. 23, 2005

(65) Prior Publication Data
US 2006/0066349 A1    Mar. 30, 2006

(30) Foreign Application Priority Data
Sep. 29, 2004    (JP) .............................. 2004-284274

(51) Int. Cl.
*H03K 19/0175* (2006.01)
(52) U.S. Cl. .............................. 326/80; 326/29; 326/83; 327/294
(58) Field of Classification Search ................ 326/29, 326/63, 68, 80–83; 327/34, 165, 291, 294, 327/256–259
See application file for complete search history.

(56) References Cited

U.S. PATENT DOCUMENTS 5,896,053 A * 4/1999 Prentice ...................... 327/255

6,339,553 B1 * 1/2002 Kuge ......................... 365/194

FOREIGN PATENT DOCUMENTS

| JP | 9-148913 | 6/1997 |
|---|---|---|
| JP | 2002-76882 | 3/2002 |

\* cited by examiner

*Primary Examiner*—Rexford Barnie
*Assistant Examiner*—Jason Crawford
(74) *Attorney, Agent, or Firm*—Cooper & Dunham LLP

(57) ABSTRACT

A level shift circuit for shifting levels of a pair of binary input signals having a first voltage range to produce a pair of binary output signals having a second voltage range includes a first circuit to shift a level of a first one of the binary input signals thereby to produce a first signal having the second voltage range, a second circuit to shift a level of a second one of the binary input signals thereby to produce a second signal having the second voltage range, and a timing adjustment circuit to produce the binary output signals by adjusting a pulse width thereof in response to the first and second signals such that the pulse width is equal to a time interval from when one of the first and second circuits stops level shift operation to when another one of the first and second circuits stops level shift operation.

10 Claims, 9 Drawing Sheets

LEVEL SHIFT CIRCUIT HAVING TIMING ADJUSTMENT CIRCUIT FOR MAINTAINING DUTY RATIO

BACKGROUND OF THE INVENTION

1. Field of the Invention

The present invention generally relates to level shift circuits, and particularly relates to a level shift circuit that receives a pair of input signals having two complementary levels with signal amplitudes ranging between a first predetermined positive-side power supply voltage and a predetermined negative-side power supply voltage, and produces a pair of output signals having two complementary levels by level-shifting the received signals to signals having amplitudes ranging between a second predetermined positive-side power supply voltage larger than the first predetermined positive-side power supply voltage and the predetermined negative-side power supply voltage

2. Description of the Related Art

FIG. 6 is a circuit diagram showing an example of the configuration of a level shift apparatus including a related-art level shift circuit.

The level shift apparatus 101 shown in FIG. 6 receives a signal output from an internal circuit 102 that operates by use of a first predetermined positive-side power supply voltage VDD1 (e.g., 1.2 V) as a power supply. The level shift apparatus 101 generates a pair of signals by level-shifting the received signal and a signal having a signal level inverse to the signal level of the received signal for provision to an external circuit 103 that operates by use of a second positive-side power supply voltage VDD2 (e.g., 3.3 V) as a power supply. As shown in FIG. 6, the level shift apparatus 101 includes an inverter circuit 104 operating by use of the first positive-side power supply voltage VDD1 as a power supply as does the internal circuit 102, and also includes a level shift circuit 105 operating by use of the second positive-side power supply voltage VDD2 as a power supply as does the external circuit 103. The level shift circuit 105 includes a level shift circuit unit 106 and a waveform shaping circuit unit 107. The level shift circuit unit 106 receives a signal INA output from the internal circuit 102, and also receives a signal INB having a signal level inverse to the signal level of the signal INA. The level shift circuit unit 106 shifts the levels of the received signals INA and INB to produce signals OUTA1 and OUTB1. The waveform shaping circuit unit 107 shapes the waveforms of the signals OUTA1 and OUTB1 output from the level shift circuit unit 106, thereby outputting signals OUTA and OUTB to the external circuit 103.

In FIG. 6, as the signal INA having a LOW level is supplied from the internal circuit 102, the signal INB output from the inverter circuit 104 becomes a HIGH level. As the LOW-level signal INA and the HIGH-level signal INB are supplied to the level shift circuit unit 106, a P-channel-type MOS transistor (hereinafter referred to as "PMOS transistor") P104 and N-channel-type MOS transistor (hereinafter referred to as "NMOS transistor") N103 are turned off, and a NMOS transistor N102 and PMOS transistor P105 are turned on. In response to the turning-on of the NMOS transistor N102, a PMOS transistor P103 is turned on, so that the output signal OUTA and output signal OUTB are set to LOW level and HIGH level, respectively.

When the signal INA changes from the LOW level to the HIGH level, the signal INB output from the inverter circuit 104 changes from the HIGH level to the LOW level. As the HIGH-level signal INA and the LOW-level signal INB are supplied to the level shift circuit unit 106, the NMOS transistor N102 and the PMOS transistor P105 are turned off, and the NMOS transistor N103 and PMOS transistor P104 are turned on. In response to the turning-on of the NMOS transistor N103, a joint point between the PMOS transistor P105 and the NMOS transistor N103 is set to a LOW voltage level, so that the output signal OUTB1 is changed to the LOW level, and, also, the PMOS transistor P102 is turned on. As the PMOS transistor 102 is turned on, a joint point between the PMOS transistor P104 and the NMOS transistor N102 is set to a HIGH voltage level since the PMOS transistor P104 is already in the turned-on state. This results in the output signal OUTA1 being set to the HIGH level.

As the signal INA changes from the HIGH level to the LOW level, the signal INB output from the inverter circuit 104 changes from the LOW level to the HIGH level. As the LOW-level signal INA and the HIGH-level signal INB are supplied to the level shift circuit unit 106, the PMOS transistor P104 and NMOS transistor N103 are turned off, and the NMOS transistor N102 and PMOS transistor P105 are turned on. In response to the turning-on of the NMOS transistor N102, a joint point between the PMOS transistor P104 and the NMOS transistor N102 is set to a LOW voltage level, so that the output signal OUTA is changed to the LOW level, and, also, the PMOS transistor P103 is turned on. As the PMOS transistor 103 is turned on, a joint point between the PMOS transistor P105 and the NMOS transistor N103 is set to a HIGH voltage level since the PMOS transistor P103 is already in the turned-on state. This results in the output signal OUTB being set to the HIGH level.

There are also related-art level shift apparatuses in which the level shift circuit has a second level shift circuit unit added thereto, which operates by use of a third positive-side power supply voltage VDD3 as a power supply higher than the first positive-side power supply voltage VDD1 and lower than the second positive-side power supply voltage VDD2 (see Patent Document 1, for example) FIG. 7 is a circuit diagram showing an example of the configuration of such related-art level shift circuit. As shown in FIG. 7, a second level shift circuit unit 202 provided in the level shift circuit 105 has the same configuration as the level shift circuit unit 106. In this level shift apparatus 201, the second level shift circuit unit 202 receives signals having an amplitude Am1 ranging between the first positive-side power supply voltage VDD1 and a negative-side power supply voltage as they are supplied from the internal circuit (not shown) and the inverter circuit 104. The second level shift circuit unit 202 converts these received signals into signals having an amplitude Am2 ranging between the third positive-side power supply voltage VDD3 and the negative-side power supply voltage where the third positive-side power supply voltage VDD3 is lower than the second positive-side power supply voltage VDD2. After this, the level shift circuit unit 106 converts the signals having the amplitude Am2 into signal having an amplitude Am3 ranging between the second positive-side power supply voltage VDD2 and the negative-side power supply voltage for provision to the external circuit (not shown).

Further, related-art level shift circuits used in level shift apparatuses include a type as shown in FIG. 8 (see Patent Document 2, for example) In this type, input nodes IN1 and IN2 receive the input signals INA and INB, respectively, which have amplitude ranging between the first positive-side power supply voltage VDD1 and the negative-side power supply voltage, and output nodes OUT1 and OUT2 output the output signals OUTA and OUTB, respectively, which have amplitude ranging between the second positive-side power supply voltage VDD2 and the negative-side power supply voltage. A level shift circuit unit is provided with these nodes IN1, IN2, OUT1, and OUT2, and includes NMOS transistors N301 and N302 and PMOS transistors P305 and P306. A current mirror circuit unit is provided to charge the output nodes OUT1 and OUT2, and includes PMOS transistors P301 through P304. Further, a switch circuit unit is provided to drive the current mirror circuit unit during an interval from the reversal of the input signals INA and INB to the reversal of the output signals OUTA and OUTB, and includes NMOS transistors N303 through N306.

[Patent Document 1] Japanese Patent Application Publication No. 9-148913

[Patent Document 2] Japanese Patent Application Publication No. 2002-76882

FIG. 9 is a timing chart showing an example of the operation of the level shift apparatus 101 shown in FIG. 6. The level shift circuit unit 106 produces the signals OUTA and OUTB having the HIGH level if the received signals OUTA1 and OUTB1 have voltages larger than a predetermined threshold, and produces the signals OUTA and OUTB having the LOW level if the received signals OUTA1 and OUTB1 have voltages lower than or equal to the predetermined threshold.

As shown in FIG. 9, the input signal INA input from the internal circuit 102 into the level shift circuit 105 and the input signal INB input from the inverter circuit 104 into the level shift circuit 105 are complementary signals that have signal levels complementary to each other. The duty cycle of the input signals INA and INB is 50%. The output signals OUTA1 and OUTB1 output from the level shift circuit unit 106, however, are provided such that one of the output signals changes to the HIGH level after the other changes to the LOW level, resulting in the former having a slow signal rise. Consequently, the signals OUTA and OUTB made by shaping the waveform of the output signals OUTA1 and OUTB1 are not provided as complementary signals, having different duty cycles and phases than the input signals INA and INB. Accordingly, the related-art level shift circuit has a problem (first problem) in that the duty cycle and phase differ between the input signals INA and INB and the output signals OUTA and OUTB.

Further, if a difference between the power supply voltages VDD1 and VDD2 is large as in the case of 1.2 V and 3.3 V in FIG. 6, in order for the level shift circuit 105 to operate properly, the on-resistance of each of the NMOS transistors N102 and N103 provided in the level shift circuit unit 106 must be smaller than a sum of the on-resistances of the PMOS transistors that are connected in series to each of the NMOS transistors N102 and N103. If the NMOS transistor N102, PMOS transistor P104, and PMOS transistor P102 have on-resistances Rn1, Rp1, and Rp2, respectively, the condition Rn1<Rp1+Rp2 must be satisfied. In order to satisfy this condition, each of the NMOS transistors N102 and N103 needs to be so designed as to have an extremely large device size, or each of the PMOS transistors P102 through P105 needs to be so designed as to have an extremely small device size. The former design strategy results in the size of the level shift circuit 105 being extremely large, and the latter design strategy results in the speed of voltage-level conversion by the level shift circuit 105 being extremely slow. This is a second problem of the related-art level shift circuit.

As shown in FIG. 7, the level shift circuit 105 of the level shift apparatus 201 may be provided with the second level shift circuit unit 202 that operates by use of the power supply voltage VDD3 as a power supply. This provision makes it possible to reduce a voltage difference between the input signals and the output signals for each of the level shift circuit units 106 and 202. As a result, it is possible to allow the level shift circuit 105 to operate properly without changing the device size of each of the transistors provided in the level shift circuit 105. The use of such a level shift circuit 105, however, necessitates the new power supply voltage VDD3. Also, the two output signals of each of the level shift circuit units 106 and 202 are provided such that one of the output signals changes to the HIGH level after the other changes to the LOW level, resulting in a slow signal rise. This creates a difference between the rise time and fall time of the output signals, so that both the duty cycle and the phase differ between the input signals into the level shift circuit 105 and the output signals from the level shift circuit 105. In order to obviate this, the speed of signal-level conversion at each of the level shift circuit units 106 and 202 needs to be increased. Namely, a ratio of the device size of the PMOS transistors to the device size of the NMOS transistors in each of the level shift circuit units 106 and 202 needs to be increased. Thus, the second problem cannot be overcome after all. In other words, it is impossible to obviate the first problem and the second problem simultaneously with respect to the level shift circuit 105.

The level shift circuit 105 shown in FIG. 8 can overcome the second problem whilst it is a single circuit. Even if this level shift circuit 105 is used, however, one of the output signals OUTA1 and OUTB1 changes to the HIGH level after the other changes to the LOW level. As a result, the output signal OUTA1 and OUTA2 and the signals obtained by shaping the waveforms of these signals are not complementary signals, having different duty cycles and phases that the inputs signals INA and INB. Namely, the use of the level shift circuit 105 shown in FIG. 8 cannot obviate the first problem and the second problem at the same time.

Accordingly, there is a need for a level shift circuit that can properly operate even when a voltage difference between input signals and output signals is large, and that can maintain the same duty cycle and phase between the input signals and the output signals.

SUMMARY OF THE INVENTION

It is a general object of the present invention to provide a level shift circuit that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a level shift circuit particularly pointed out in the specification in such full, clear, concise, and exact terms as to enable a person having ordinary skill in the art to practice the invention.

To achieve these and other advantages in accordance with the purpose of the invention, the invention provides a level shift circuit for shifting levels of a pair of binary input signals complementary to each other having a first voltage range to produce a pair of binary output signals complementary to each other having a second voltage range, the level shift circuit including a first level shift circuit unit configured to shift a level of a first one of the binary input signals thereby to produce a first level-shifted signal having the second voltage range, a second level shift circuit unit configured to shift a level of a second one of the binary input signals thereby to produce a second level-shifted signal having the second voltage range, one of the first and second level shift circuit units starting level shift operation when another one of the first and second level shift circuit units stops level shift operation, and a timing adjustment circuit unit configured to produce the binary output signals having the second voltage range by adjusting a pulse width thereof in response to the first level-shifted signal and the second level-shifted signal such that the pulse width is equal to a time interval from when one of the first and second level shift circuit units stops level shift operation to when another one of the first and second level shift circuit units stops level shift operation.

According to at least one embodiment of the present invention, any given one of the first and second level shift circuit units starts level shift operation when the other one of the first and second level shift circuit units stops level shift operation, and the timing adjustment circuit unit produces the binary output signals having the second voltage range by adjusting a pulse width thereof in response to the first level-shifted signal and the second level-shifted signal such that the pulse width is equal to a time interval from when one of the first and second level shift circuit units stops level shift operation to when the other one of the first and second level shift circuit units stops level shift operation. This provides for the level shift circuit having a small-scale circuit configuration to operate properly even when a voltage difference between the input signals and the output signals is large, and to maintain the same duty cycle and phase between the input signals and the output signals.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

Figure 1:
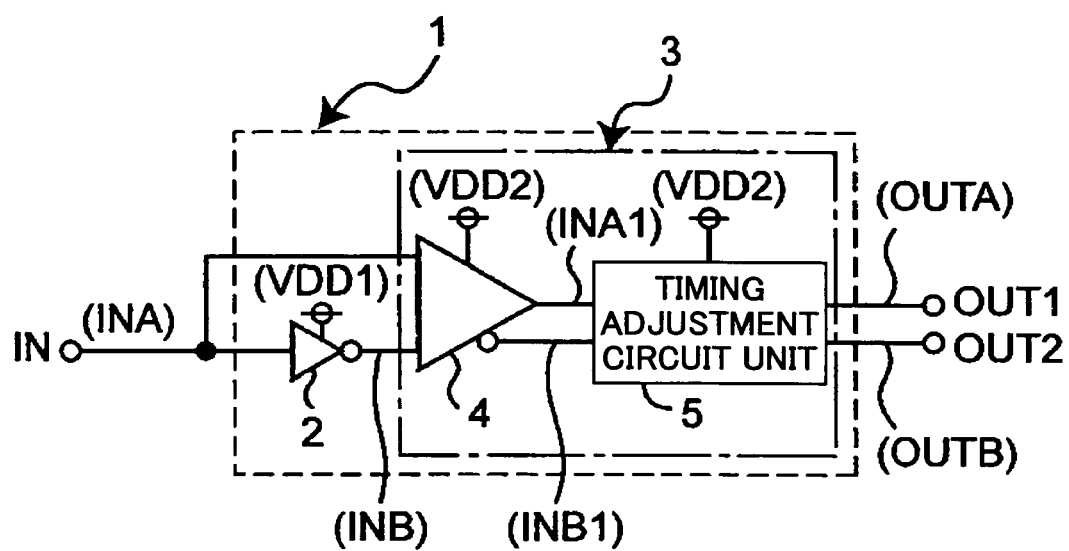
FIG. 1 is a circuit diagram showing an example of the configuration of a level shift apparatus including a level shift circuit according to the present invention.

FIG. 1 is a circuit diagram showing an example of the configuration of a level shift apparatus including a level shift circuit according to the present invention. As shown in FIG. 1, a level shift apparatus 1 includes an inverter circuit 2 operating by use of a first predetermined positive-side power supply voltage VDD1 (e.g., 1.2 V) as a power supply, and also includes a level shift circuit 3 operating by use of a second predetermined positive-side power supply voltage VDD2 (e.g., 3.3 V) as a power supply where the second positive-side power supply voltage VDD2 is larger than the first positive-side power supply voltage VDD1. The level shift circuit 3 includes a level shift circuit unit 4 and a timing adjustment circuit unit 5. An input node IN of the inverter circuit 2 receives a signal INA output from an internal circuit (not shown) that operates by use of the power supply voltage VDD1 as a power supply. The inverter circuit 2 inverts the received signal INA to produce a signal INB for provision to the level shift circuit 3. The level shift circuit 3 receives the signal INA and the signal INB output from the internal circuit and the inverter circuit 2, respectively. The level shift circuit unit 4 shifts the levels of the input signals INA and INB to produce signals INA1 and INB1 for provision to the timing adjustment circuit unit 5. The timing adjustment circuit unit 5 adjusts the timing of level changes with respect to each of the signals INA1 and INB1 output from the level shift circuit unit 4 to produce output signal OUTA and OUTB, which are output from respective output nodes OUT1 and OUT2.

Figure 2:
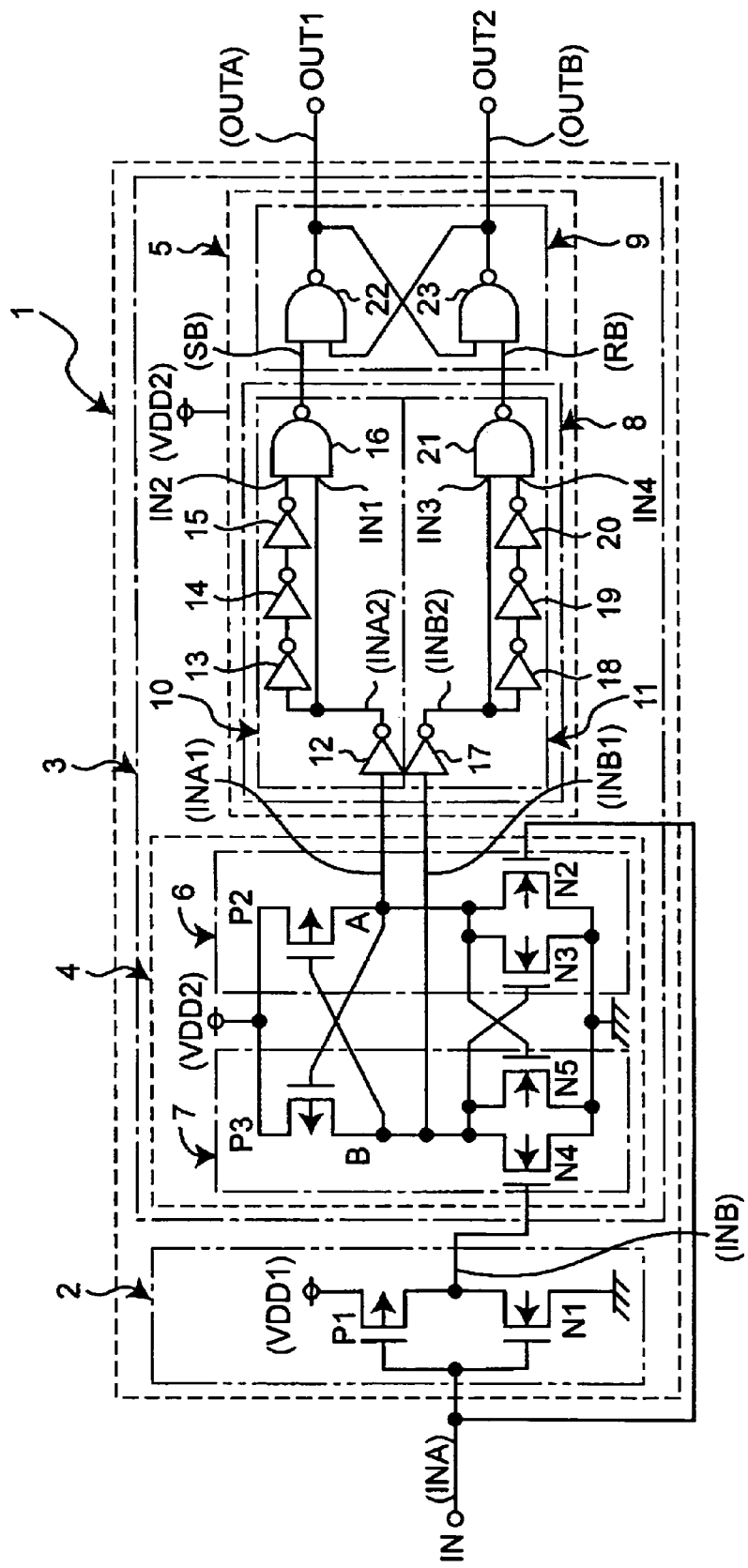
FIG. 2 is a circuit diagram showing an example of the detailed configuration of the level shift apparatus shown in FIG. 1.

FIG. 2 is a circuit diagram showing an example of the detailed configuration of the level shift apparatus shown in FIG. 1. As shown in FIG. 2, the inverter circuit 2 includes a PMOS transistor P1 and an NMOS transistor N1 forming an inverter circuit operating by use of the power supply voltage VDD1 as a power supply. In the inverter circuit 2, the gate of the PMOS transistor P1 and the gate of the NMOS transistor N1 are connected to each other, and the joint point constitutes the input node IN. The input node IN receives the signal INA output from the internal circuit (not shown) operating by use of the power supply voltage VDD1 as a power supply.

The level shift circuit unit 4 of the level shift circuit 3 includes a first level shift circuit unit 6 and a second level shift circuit unit 7. The first level shift circuit unit 6 includes a PMOS transistor P2 and NMOS transistors N2 and N3, and the second level shift circuit unit 7 includes a PMOS transistor P3 and NMOS transistors N4 and N5. The PMOS transistor P2 serves as a first P-channel-type transistor, the NMOS transistor N2 serving as a first N-channel-type transistor, and the NMOS transistor N3 serving as a second N-channel-type transistor. The PMOS transistor P3 serves as a second P-channel-type transistor, the NMOS transistor N4 serving as a third N-channel-type transistor, and the NMOS transistor N5 serving as a fourth N-channel-type transistor.

In the level shift circuit unit 4, a series circuit of the PMOS transistor P3 and the NMOS transistor N4 is provided between the power supply voltage VDD2 and the ground voltage, and a series circuit of the PMOS transistor P2 and the NMOS transistor N2 are connected in parallel. The gate of the PMOS transistor P3 is coupled to a joint point A between the PMOS transistor P2 and the NMOS transistor N2, and the gate of the PMOS transistor P2 is coupled to a joint point B between the PMOS transistor P3 and the NMOS transistor N4. Between the joint point B and the ground voltage is connected the NMOS transistor N5. Further, the NMOS transistor N3 is connected between the joint point A and the ground voltage. The gate of the NMOS transistor N5 and the gate of the NMOS transistor N3 are coupled to the joint point A and the joint point B, respectively. The gate of the NMOS transistor N4 receives the signal INB supplied from the inverter circuit 2. The gate of the transistor N2 receives the signal INA supplied from the internal circuit. As the output signals of the level shift circuit unit 4, signals INA1 and INB1 are output via the joint point A and the joint point B, respectively.

The first level shift circuit unit 6 produces the signal INA1 on the basis of the input signal INA, and the second level shift circuit unit 7 produces the signal INB1 on the basis of the input signal INB.

The timing adjustment circuit unit 5 of the level shift circuit 3 includes a pulse generating circuit 8 and a reset/set flip-flop (hereinafter referred to as "RS flip-flop") circuit 9. The pulse generating circuit 8 includes a first pulse generating circuit 10 and a second pulse generating circuit 11. The first pulse generating circuit 10 includes inverter circuits 12 through 15 and a NAND gate 16. The second pulse generating circuit 11 includes inverter circuits 17 through 20 and a NAND gate 21. The input nodes of the inverter circuits 12 and 17 are coupled to the joint points A and B, respectively, of the level shift circuit unit 4. The inverter circuits 13 through 15 are connected in series, with the input node of the inverter circuit 13 being coupled to the output node of the inverter circuit 12. The NAND gate 16 has an input node IN1 thereof coupled to the output node of the inverter circuit 12 and an input node IN2 thereof coupled to the output node of the inverter circuit 15. The inverter circuits 18 through 20 are connected in series, with the input node of the inverter circuit 18 being coupled to the output node of the inverter circuit 17. The NAND gate 21 has an input node IN3 thereof coupled to the output node of the inverter circuit 17 and an input node IN4 thereof coupled to the output node of the inverter circuit 20. The RS flip-flop circuit serves as an output circuit unit. The NAND gate 16 serves as a first logic circuit, and the NAND gate 21 serves as a second logic circuit. The series circuit comprised of the inverter circuits 13 through 15 serves as a first delay circuit, and the series circuit comprised of the inverter circuits 18 through 20 serves as a second delay circuit. In the pulse generating circuit 8, the number of inverter circuits included in each delay circuit is not limited to three, and may alternatively be any odd number.

The input nodes of the inverter circuits 12 and 17 receive the signals INA1 and INB1, respectively, from the level shift circuit unit 4. The inverter circuit 12 inverts the signal level of the received signal INA1 to produce a signal INA2. The signal INA2 is supplied to the input node of the inverter circuit 13 and the input node IN1 of the NAND gate 16. The series circuit comprised of the inverter circuits 13 through 15 serves as a delay circuit so as to supply a signal having a signal level inverse to that of the signal INA2 to the input node IN2 of the NAND gate 16 after a predetermined delay time T from the inputting of the signal INA2. That is, with the delay T after the inputting of the signal INA2 into the input node IN1 of the NAND gate 16, the signal having a signal level inverse to that of the signal INA2 is input into the input node IN2. In such a case, as the signal INA1 changes its signal level, the signal input into the input node IN2 of the NAND gate 16 has a change in its signal level that is delayed by the time T relative to the signal input into the input node IN1. AS a result, the signals input into the input nodes IN1 and IN2 end up having the same signal level for the length of the time T. The NAND gate 16 outputs a LOW-level signal when the signals input into the input nodes IN1 and IN2 are both set to the HIGH level, and outputs a HIGH-level signal otherwise. It should be noted that the signals input into the input nodes IN1 and IN2 are both set to the HIGH level when the signal INA1 changes from the HIGH level to the LOW level.

By the same token, the inverter circuit 17 inverts the signal level of the received signal INB1 to produce a signal INB2. The signal INB2 is supplied to the input node of the inverter circuit 18 and the input node IN3 of the NAND gate 21. The series circuit comprised of the inverter circuits 18 through 20 serves as a delay circuit so as to supply a signal having a signal level inverse to that of the signal INB2 to the input node IN4 of the NAND gate 21 after a predetermined delay time T from the inputting of the signal INB2. The NAND gate 21 outputs a LOW-level signal when the signals input into the input nodes IN3 and IN4 are both set to the HIGH level, and outputs a HIGH-level signal otherwise. It should be noted that the signals input into the input nodes IN3 and IN4 are both set to the HIGH level when the signal INB1 changes from the HIGH level to the LOW level.

The RS flip-flop circuit 9 is a typical RS flip-flop circuit comprised of NAND gates 22 and 23. The NAND gate 22 has one of the input nodes thereof serving as a set node of the RS flip-flop circuit, which receives the output signal of the NAND gate 16 as an input signal SB. The NAND circuit 23 has one of the input nodes thereof serving as a reset node of the RS flip-flop circuit, which receives the output signal of the NAND gate 21 as an input signal RB. The RS flip-flop circuit 9 outputs signals OUTA and OUTB that are at the HIGH level and the LOW level, respectively, when the input signal SB and the input signal RB are at the LOW level and the HIGH level, respectively, and outputs the signals OUTA and OUTB that are at the LOW level and the HIGH level, respectively, when the input signal SB and the input signal RB are at the HIGH level and the LOW level, respectively. When the input signals SB and RB are both at the HIGH level, the RS flip-flop circuit 9 maintains its output signal level as it is. It should be noted that all the circuit components of the timing adjustment circuit unit 5 operate by use of the power supply voltage VDD2 as a power supply.

Figure 3:
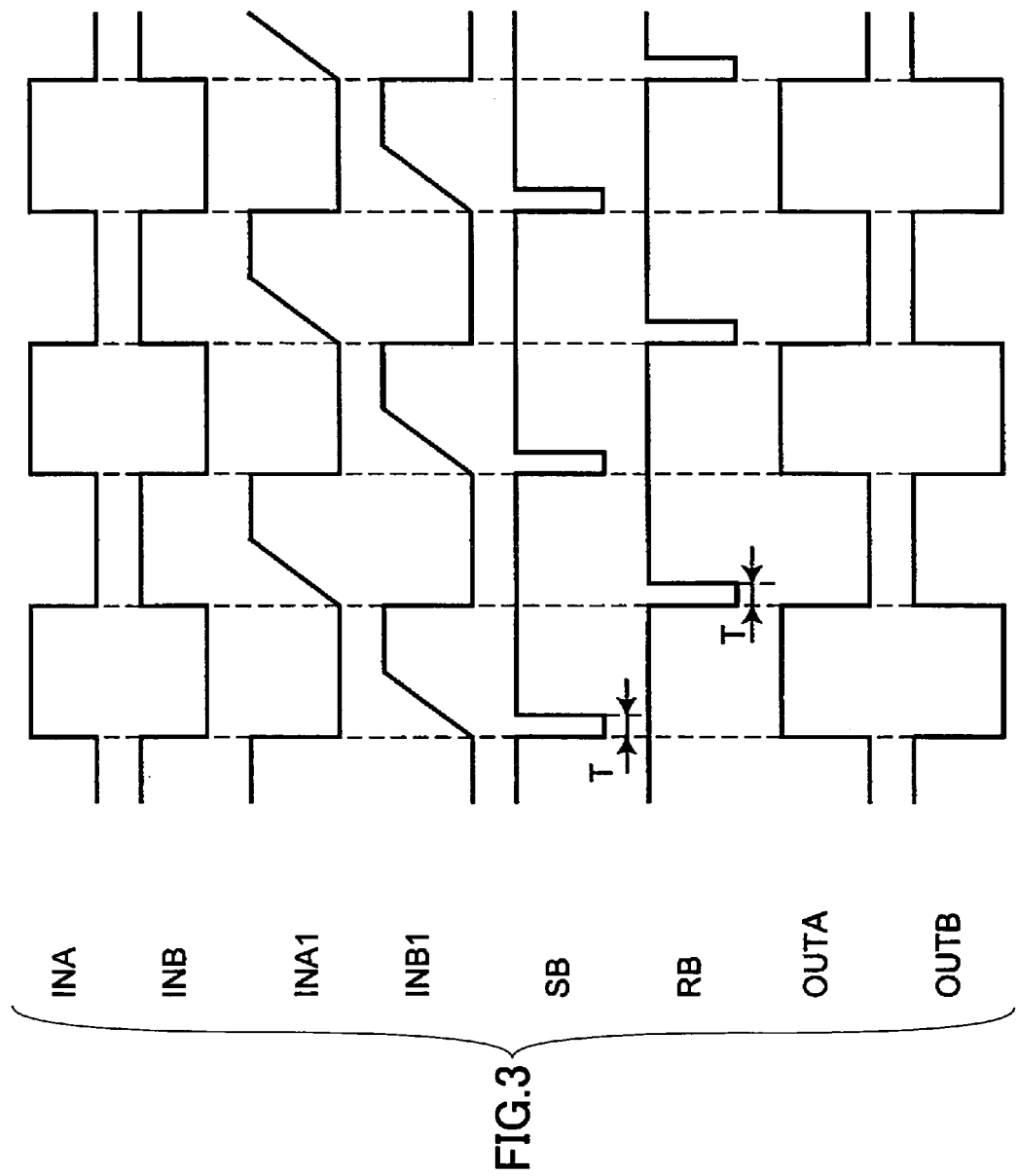
FIG. 3 is a timing chart showing an example of the operation of a level shift circuit shown in FIG. 2.

In the following, the operation of the level shift circuit 3 will be described. FIG. 3 is a timing chart showing an example of the operation of the level shift circuit 3 shown in FIG. 2. In FIG. 3, as the LOW-level signal INA and the HIGH-level signal INB are input, the NMOS transistor N4 is turned on, and the NMOS transistor N2 is turned off. In response to the turning-on of the NMOS transistor N4, the voltage level of the joint point B is set to the LOW level, thereby setting the output signal INB1 to the LOW level. Further, the LOW voltage level of the joint point B causes the NMOS transistor N3 to be turned off and the PMOS transistor P2 to be turned on. AS the PMOS transistor P2 becomes conductive, the voltage level of the joint point A is set to the HIGH level, resulting in the output signal INA1 being at the HIGH level.

When the output signals INA1 and INB1 are set to the HIGH level and the LOW level, respectively, the signals INA2 and INB2 inverted by the respective inverter circuits 12 and 17 are set to the LOW level and the HIGH level, respectively. At this time, the node IN1 of the NAND gate 16 receives the LOW level signal, and the node IN2 thereof receives the HIGH level signal after a delay equal to the time T. When these two input signals are at the LOW level and the HIGH level, respectively, the NAND gate 16 outputs the signal SB that is at the HIGH level. The node IN3 of the NAND gate 21 receives the HIGH level signal, and the node IN4 thereof receives the LOW level signal after a delay equal to the time T. When these two input signals are at the HIGH level and the LOW level, respectively, the NAND gate 21 outputs the signal RB that is at the HIGH level. When the input signals SB and RB are both at the HIGH level, the RS flip-flop circuit 9 maintains the current levels of its output signals OUTA and OUTB.

Thereafter, the signal INA input into the level shift circuit 3 changes from the LOW level to the HIGH level, and the signal INB changes from the HIGH level to the LOW level. In response, the NMOS transistor N4 is turned off, and the NMOS transistor N2 is turned on. In response to the turning-on of the NMOS transistor N2, the voltage level of the joint point A is set to the LOW level, thereby setting the output signal INA1 to the LOW level. Further, the LOW voltage level of the joint point A causes the NMOS transistor N5 to be turned off and the PMOS transistor P3 to be turned on. AS the PMOS transistor P3 becomes conductive, the voltage level of the joint point B is set to the HIGH level, resulting in the output signal INB1 being at the HIGH level. Since the PMOS transistor P3 is turned on after the signal INA1 is set to the LOW level, the level change of the signal INB1 delays relative to the level change of the signal INA1, exhibiting a slow rise in its signal waveform as shown in FIG. 3.

When the output signal INA1 is changed from the HIGH level to the LOW level, the signal SB supplied from the NAND gate 16 to the NAND gate 22 changes to the LOW level only for the length of the predetermined time T. Specifically, when the signal INA1 is changed from the HIGH level to the LOW level, the node IN1 of the NAND gate 16 receives the HIGH-level signal, and the node IN4 thereof receives the LOW-level signal at a delay equal to the time T. During this time period T, the signals input into the NAND gate 16 are both at the HIGH level. When the two input signals are at the HIGH level, the NAND gate 16 outputs the signal SB that is set at the LOW level. On the other hand, the signal RB supplied from the NAND gate 21 to the NAND gate 23 is maintained at the HIGH level. Since the input signal SB and the input signal RB are LOW and HIGH, respectively, the RS flip-flop circuit 9 outputs the signals OUTA and OUTB that are set at the HIGH level and the LOW level, respectively. When both of the input signals SB and RB are set to the HIGH level thereafter, the output signals OUTA and OUTB are maintained at their current levels.

Thereafter, the signal INA input into the level shift circuit 3 changes from the HIGH level to the LOW level, and the signal INB changes from the LOW level to the HIGH level. In response, the NMOS transistor N2 is turned off, and the NMOS transistor N4 is turned on. In response to the turning-on of the NMOS transistor N4, the voltage level of the joint point B is set to the LOW level, thereby setting the output signal INB1 to the LOW level. Further, the LOW voltage level of the joint point B causes the NMOS transistor N3 to be turned off and the PMOS transistor P2 to be turned on. AS the PMOS transistor P2 becomes conductive, the voltage level of the joint point A is set to the HIGH level, resulting in the output signal INA1 being at the HIGH level. Since the PMOS transistor P2 is turned on after the signal INB1 is set to the LOW level, the level change of the signal INA1 delays relative to the level change of the signal INB1, exhibiting a slow rise in its signal waveform as shown in FIG. 3.

When the output signal INB1 is changed from the HIGH level to the LOW level, the signal RB supplied from the NAND gate 21 to the NAND gate 23 changes to the LOW level only for the length of the predetermined time T. Specifically, when the signal INB1 is changed from the HIGH level to the LOW level, the node IN3 of the NAND gate 21 receives the HIGH-level signal, and the node IN4 thereof receives the LOW-level signal at a delay equal to the time T. During this time period T, the signals input into the NAND gate 21 are both at the HIGH level. When the two input signals are at the HIGH level, the NAND gate 21 outputs the signal RB that is set at the LOW level. On the other hand, the signal SB supplied from the NAND gate 16 to the NAND gate 22 is maintained at the HIGH level. Since the input signal SB and the input signal RB are HIGH and LOW, respectively, the RS flip-flop circuit 9 outputs the signals OUTA and OUTB that are set at the LOW level and the HIGH level, respectively. When both of the input signals SB and RB are set to the HIGH level thereafter, the output signals OUTA and OUTB are maintained at their current levels.

As shown in FIG. 3, the level shift circuit 3 according to the first embodiment has the same duty cycle and the same phase between the input signals INA and INB and the output signals OUTA and OUTB.

In the related-art level shift circuits, one of the output signals changes from the LOW level to the HIGH level after the other of the output signals changes from the HIGH level to the LOW level. Because of this, the speed of a level change differs between at the time of a signal rise and at the time of a signal fall with respect to each output signal of the level shift circuit. The duty cycle and phase thus end up being different between the input signals and the output signals. According to the level shift circuit 3 of the first embodiment, on the other hand, the pulse generating circuit 8 is provided at the stage following the level shift circuit unit 4, and generates a pulse in response to a change from the HIGH level to the LOW level in one of the output signals of the first and second level shift circuit units, followed by changing the level of the output signals OUTA and OUTB in response to the pulse generation. This ensures that the output signals OUTA and OUTB are changed without waiting for the output signals of the first and second level shift circuit units to change from the LOW level to the HIGH level. The level shift circuit of the first embodiment, while being implemented through a small-scale circuit configuration, can thus properly operate even when a voltage difference between the input signals and the output signals is large, and can maintain the same duty cycle and the same phase between the input signals INA and INB and the output signals OUTA and OUTB.

The level shift circuit 3 of the first embodiment receives the two input signals INA and INB having amplitude ranging between the first positive-side power supply voltage VDD1 and the ground voltage serving as a negative-side power supply voltage, and shifts the levels of the received signals to produce the two output signals OUTA and OUTB having amplitude ranging between the second positive-side power supply voltage VDD2 and the ground voltage. Since the voltage level of the negative-side power supply voltage is the same with respect to each of the input signals and output signals. In this regard, the level shift circuit 3 may be regarded as performing a level shift only with respect to the level of the positive-side power supply voltage. In this sense, each of the first and second level shift circuit units 6 and 7 performs a level shift operation when the level of the output signal changes from the LOW level to the HIGH level, thereby shifting the level of the input signal equal to the first positive-side power supply voltage VDD1 to the level of the second positive-side power supply voltage VDD2, and suspends the level shift operation when the level of the output signal changes from the HIGH level to the LOW level.

Figure 4:
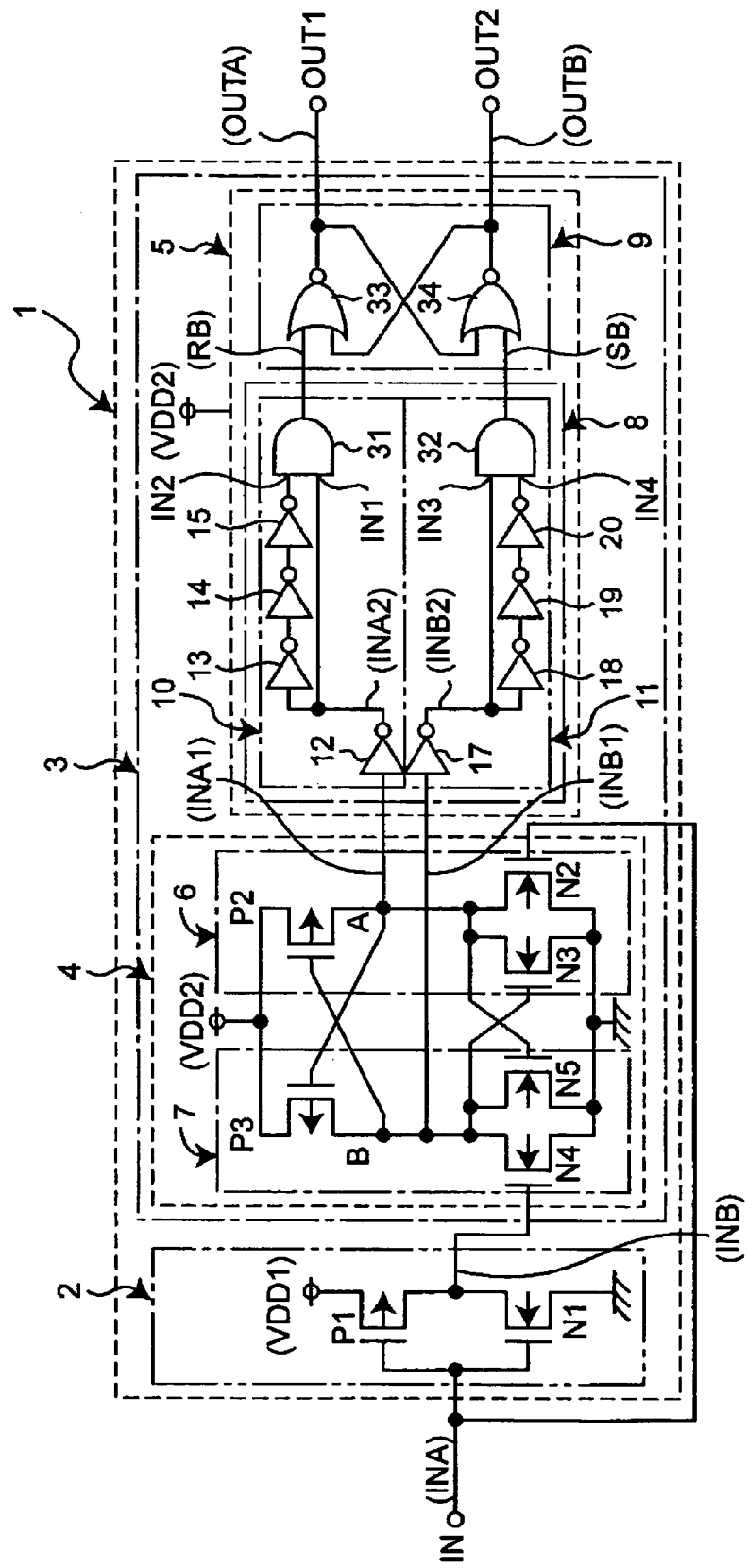
FIG. 4 is a circuit diagram showing an example of the configuration of a level shift apparatus in which the level shift circuit includes a RS flip-flop circuit based on NOR gates.

In the level shift circuit 3 as described above, the RS flip-flop circuit based on the NAND gates may be replaced with a RS flip-flop circuit based on NOR gates. FIG. 4 is a circuit diagram showing an example of the configuration of a level shift apparatus in which the level shift circuit includes a RS flip-flop circuit based on the NOR gates. In FIG. 4, the same elements as those of FIG. 1 are referred to by the same numerals, and a description thereof will be omitted. The level shift circuit shown in FIG. 4 differs from the level shift circuit of the first embodiment in that the NAND circuits of the pulse generating circuit 8 are replaced with AND gates, and in that the NAND gates of the RS flip-flop circuit 9 are replaced with NOR gates.

In the level shift circuit shown in FIG. 4, the pulse generating circuit 8 includes a first pulse generating circuit 10 and a second pulse generating circuit 11. The first pulse generating circuit 10 includes inverter circuits 12 through 15 and an AND gate 31. The second pulse generating circuit 11 includes inverter circuits 17 through 20 and an AND gate 32. The input nodes of the inverter circuits 12 and 17 are coupled to the joint points A and B, respectively, of the level shift circuit unit 4. The AND gate 31 has an input node IN1 thereof coupled to the output node of the inverter circuit 12 and an input node IN2 thereof coupled to the output node of the inverter circuit 15. The AND gate 31 outputs a HIGH-level signal when the signals input into the input nodes IN1 and IN2 are both set to the HIGH level, and outputs a LOW-level signal otherwise. It should be noted that the signals input into the input nodes IN1 and IN2 are both set to the HIGH level when the signal INA1 changes from the HIGH level to the LOW level. By the same token, the AND gate 32 has an input node IN3 thereof coupled to the output node of the inverter circuit 17 and an input node IN4 thereof coupled to the output node of the inverter circuit 20. The AND gate 32 outputs a HIGH-level signal when the signals input into the input nodes IN3 and IN4 are both set to the HIGH level, and outputs a LOW-level signal otherwise. It should be noted that the signals input into the input nodes IN3 and IN4 are both set to the HIGH level when the signal INB1 changes from the HIGH level to the LOW level.

The RS flip-flop circuit 9 is comprised of NOR gates 33 and 34. The NOR gate 33 has one of the input nodes thereof serving as a reset node of the RS flip-flop circuit, which receives the output signal of the AND gate 31 as an input signal RB. The NOR gate 34 has one of the input nodes thereof serving as a set node of the RS flip-flop circuit, which receives the output signal of the AND gate 32 as an input signal SB. The RS flip-flop circuit 9 outputs signals OUTA and OUTB that are at the LOW level and the HIGH level, respectively, when the input signal SB and the input signal RB are at the LOW level and the HIGH level, respectively, and outputs the signals OUTA and OUTB that are at the HIGH level and the LOW level, respectively, when the input signal SB and the input signal RB are at the HIGH level and the LOW level, respectively. When the input signals SB and RB are both at the LOW level, the RS flip-flop circuit 9 maintains the current levels of the output signals OUTA and OUTB as they are. The AND gate 31 serves as a first logic circuit, and the AND gate 32 serves as a second logic circuit.

Figure 5:
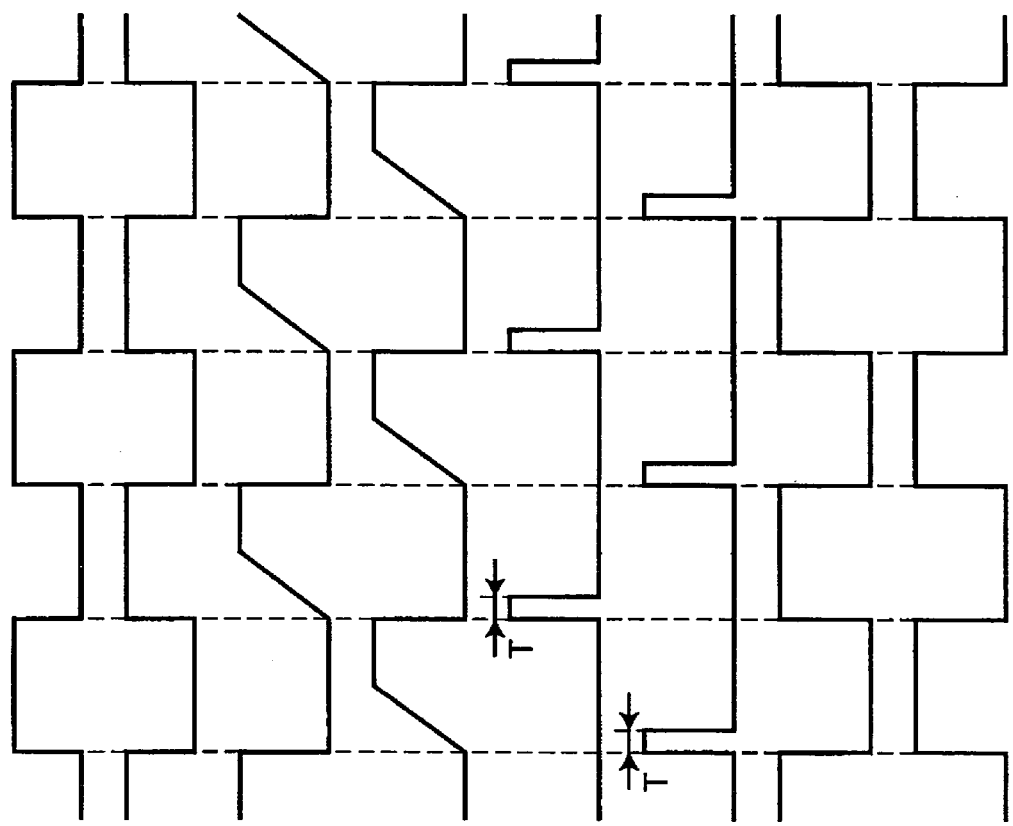
FIG. 5 is a timing chart showing an example of the operation of the level shift circuit shown in FIG. 4.

In the following, the operation of the level shift circuit 3 shown in FIG. 4 will be described. The operations of the inverter circuit 2 and the level shift circuit unit 4 are the same as the operations of these of the level shift circuit shown in FIG. 2, and a description thereof will be omitted. FIG. 5 is a timing chart showing an example of the operation of the level shift circuit 3 shown in FIG. 4. In FIG. 5, when the output signal INA1 is changed from the HIGH level to the LOW level, the signal RB supplied from the AND gate 31 to the NOR gate 33 changes to the HIGH level only for the length of the predetermined time T. Specifically, when the signal INA1 is changed from the HIGH level to the LOW level, the node IN1 of the AND gate 31 receives the HIGH-level signal, and the node IN2 thereof receives the LOW-level signal at a delay equal to the time T. During this time period T, the signals input into the AND gate 31 are both at the HIGH level. When the two input signals are at the HIGH level, the AND gate 31 outputs the signal RB that is set at the HIGH level. On the other hand, the signal SB supplied from the AND gate 32 to the NOR gate 34 is maintained at the LOW level. Since the input signal SB and the input signal RB are LOW and HIGH, respectively, the RS flip-flop circuit 9 outputs the signals OUTA and OUTB that are set at the LOW level and the HIGH level, respectively. When both of the input signals SB and RB are set to the LOW level thereafter, the output signals OUTA and OUTB are maintained at their current levels.

Thereafter, the signal INA input into the level shift circuit 3 changes from the HIGH level to the LOW level, and the signal INB changes from the LOW level to the HIGH level. In response, the output signal INB1 is changed to the LOW level. As the output signal INB1 is changed to the LOW level, the output signal INA1 is changed to the HIGH level.

When the output signal INB1 is changed from the HIGH level to the LOW level, the signal SB supplied from the AND gate 32 to the NOR gate 34 changes to the HIGH level only for the length of the predetermined time T. Specifically, when the signal INB1 is changed from the HIGH level to the LOW level, the node IN3 of the AND gate 32 receives the HIGH-level signal, and the node IN4 thereof receives the LOW-level signal at a delay equal to the time T. During this time period T, the signals input into the AND gate 32 are both at the HIGH level. When the two input signals are at the HIGH level, the AND gate 32 outputs the signal SB that is set at the HIGH level. On the other hand, the signal RB supplied from the AND gate 31 to the NOR gate 33 is maintained at the LOW level. Since the input signal SB and the input signal RB are HIGH and LOW, respectively, the RS flip-flop circuit 9 outputs the signals OUTA and OUTB that are set at the HIGH level and the LOW level, respectively. When both of the input signals SB and RB are set to the LOW level thereafter, the output signals OUTA and OUTB are maintained at their current levels.

As shown in FIG. 5, the level shift circuit 3 shown in FIG. 4 has the same duty cycle and the same phase between the input signals INA and INB and the output signals OUTA and OUTB.

According to the level shift circuit 3 shown in FIG. 4, the pulse generating circuit 8 is provided at the stage following the level shift circuit unit 4, and generates a pulse in response to a change from the HIGH level to the LOW level in one of the output signals of the first and second level shift circuit units 6 and 7, followed by changing the level of the output signals OUTA and OUTB in response to the pulse generation. This ensures that the output signals OUTA and OUTB are changed without waiting for the output signals of the first and second level shift circuit units 6 and 7 to change from the LOW level to the HIGH level. While being implemented through a small-scale circuit configuration, this level shift circuit can thus properly operate even when a voltage difference between the input signals and the output signals is large, and can maintain the same duty cycle and the same phase between the input signals INA and INB and the output signals OUTA and OUTB.

The inverter circuits 12 and 17 may be removed from the pulse generating circuit 8. In such a case, the number of the inverter circuits constituting each delay circuit may be an even number.

Figure 6:
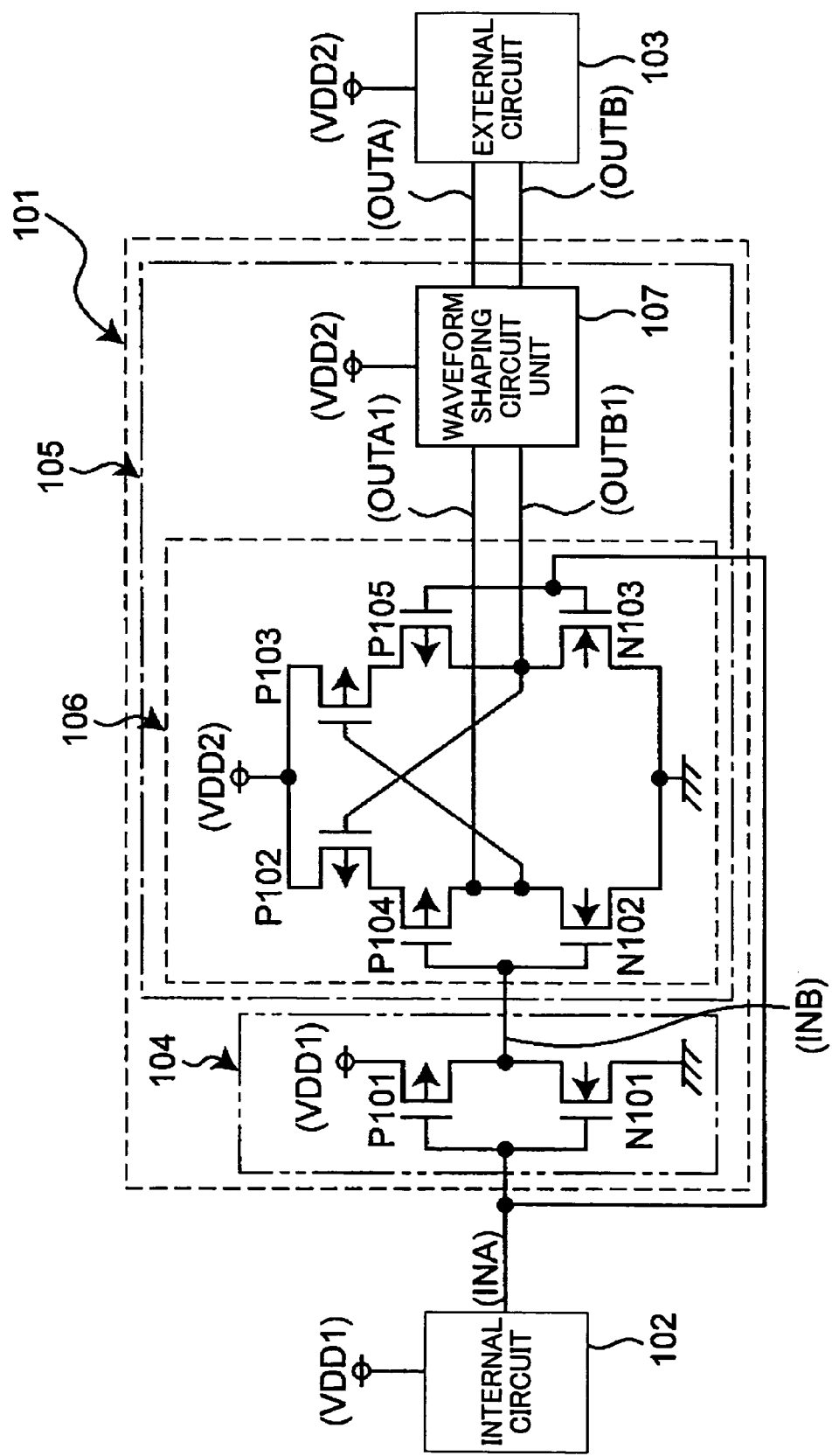
FIG. 6 is a circuit diagram showing an example of the configuration of a level shift apparatus including a related-art level shift circuit.
Figure 7:
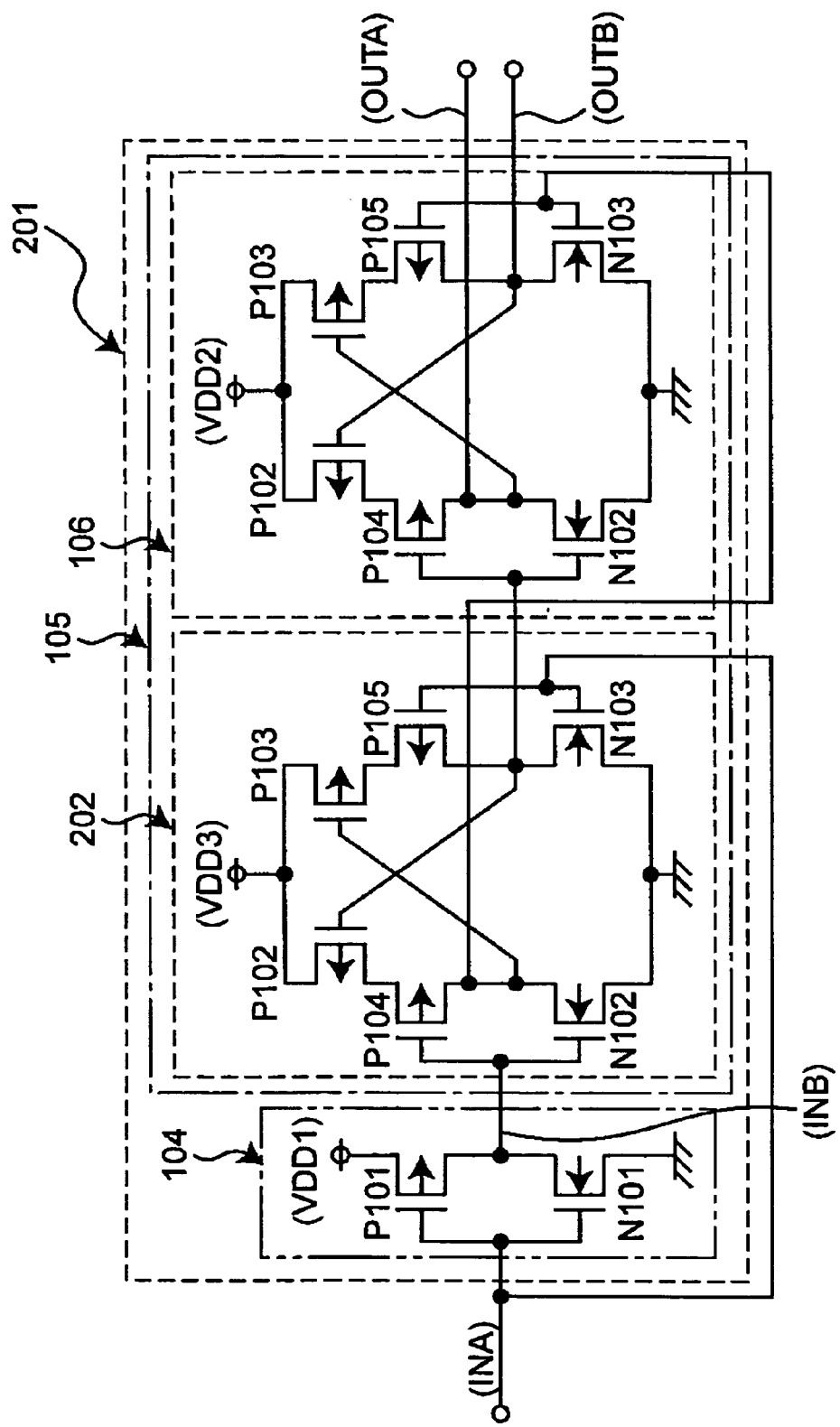
FIG. 7 is a circuit diagram showing an example of the configuration of a related-art level shift circuit.
Figure 8:
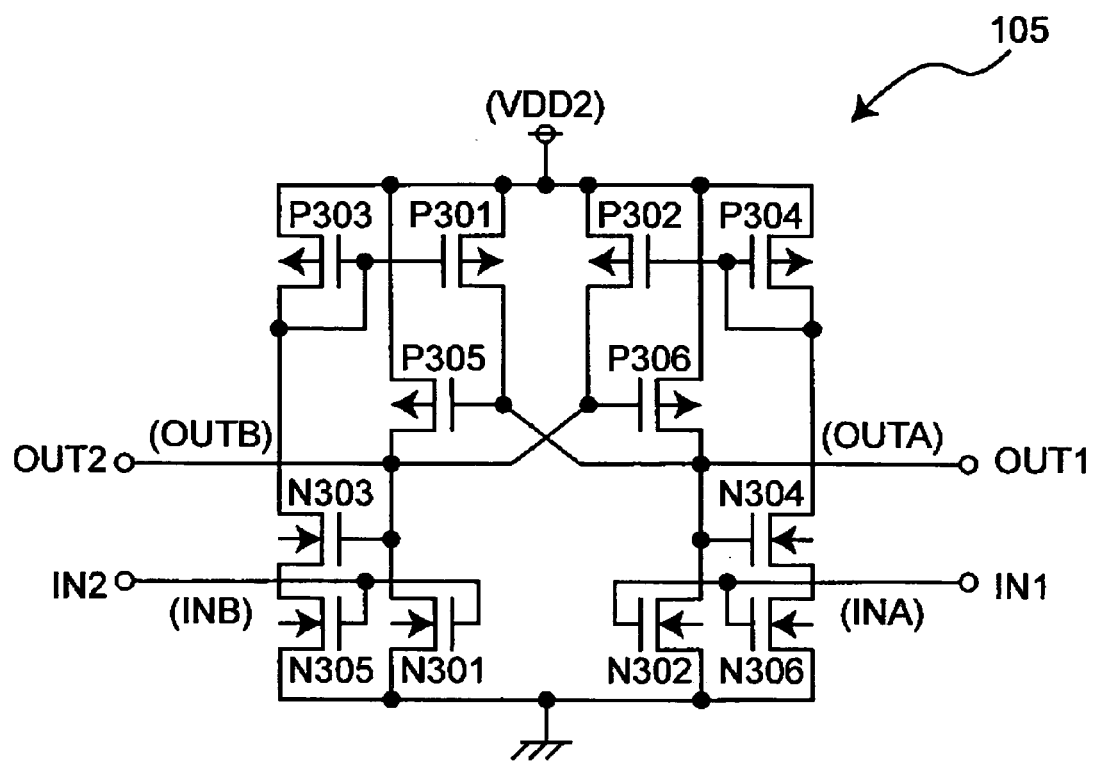
FIG. 8 is a circuit diagram showing an example of the configuration of a related-art level shift circuit.
Figure 9:
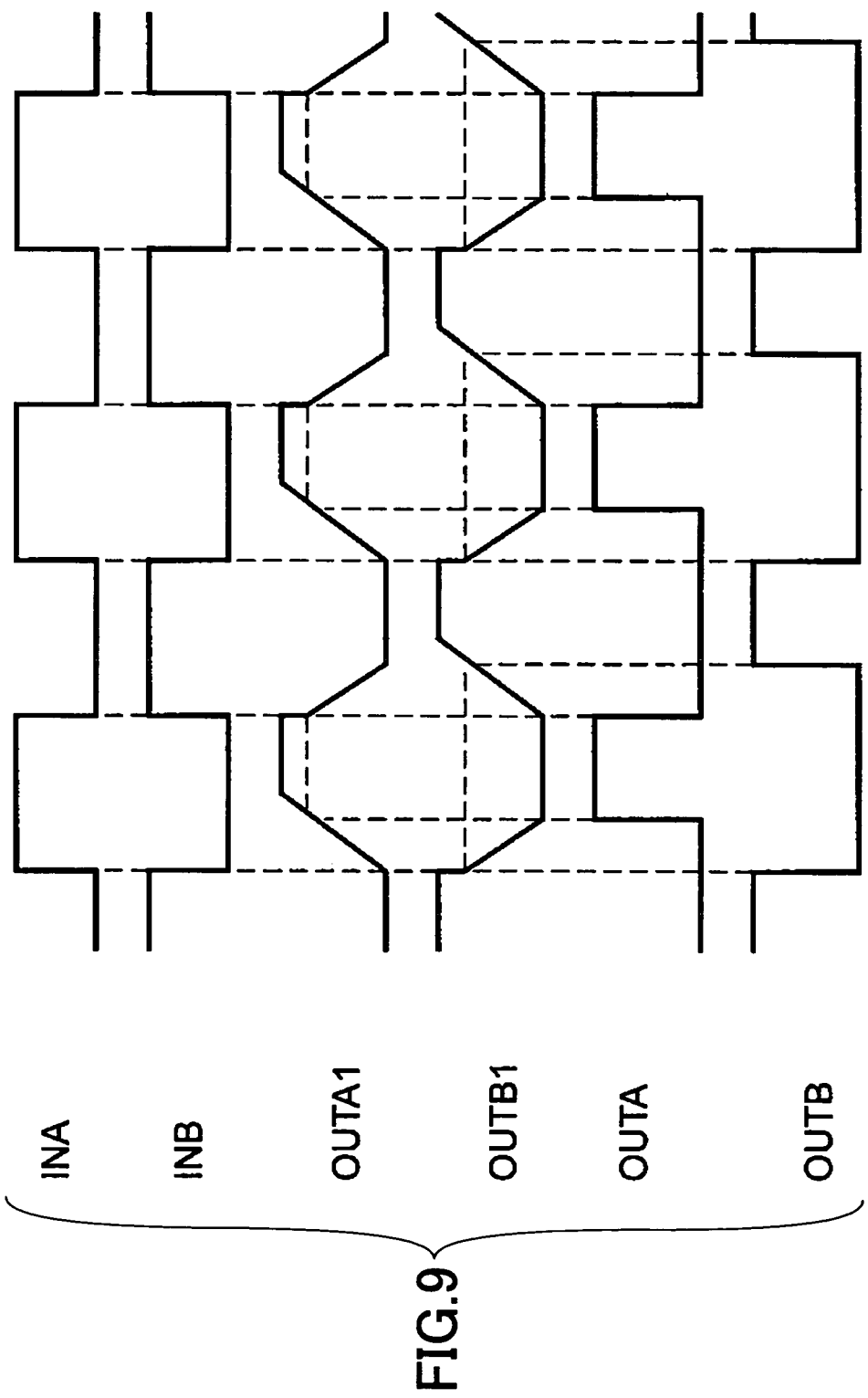
FIG. 9 is a timing chart showing an example of the operation of the level shift apparatus shown in FIG. 6.

The configuration of the level shift circuit units of the level shift circuit according to the present invention are not limited to those shown in FIG. 2 and FIG. 4. Any configuration may suffice as long as two level shift circuit units are provided, with one of the level shift circuit units starting its level shift operation when the other one of the level shift circuit units stops its level shift operation. For example, the level shift circuit 105 shown in FIG. 6, FIG. 7, and FIG. 8 may as well be used in the present invention.

Further, the present invention is not limited to these embodiments, but various variations and modifications may be made without departing from the scope of the present invention.

The present application is based on Japanese priority application No. 2004-284274 filed on Sep. 29, 2004, with the Japanese Patent Office, the entire contents of which are hereby incorporated by reference.

What is claimed is:

1. A level shift circuit for shifting levels of a pair of binary input signals complementary to each other having a first voltage range to produce a pair of binary output signals complementary to each other having a second voltage range, comprising:
    a first level shift circuit unit configured to shift a level of a first one of the binary input signals thereby to produce a first level-shifted signal having the second voltage range;
    a second level shift circuit unit configured to shift a level of a second one of the binary input signals thereby to produce a second level-shifted signal having the second voltage range, one of the first and second level shift circuit units starting level shift operation when another one of the first and second level shift circuit units stops level shift operation; and
    a timing adjustment circuit unit configured to produce the binary output signals having the second voltage range by adjusting a pulse width thereof in response to the first level-shifted signal and the second level-shifted signal such that the pulse width is equal to a time interval from when one of the first and second level shift circuit units stops level shift operation to when another one of the first and second level shift circuit units stops level shift operation.

2. The level shift circuit as claimed in claim 1, wherein said timing adjustment circuit unit includes:
    a pulse generating circuit unit configured to produce a first one-shot pulse in response to the stopping of level shift operation by said first level shift circuit unit and to produce a second one-shot pulse in response to the stopping of level shift operation by said second level shift circuit unit; and
    an output circuit unit configured to produce, as the binary output signals, signals each having a pulse width extending from the first one-shot pulse to the second one-shot pulse.

3. The level shift circuit as claimed in claim 2, wherein said pulse generating circuit unit includes:

a first pulse generating circuit configured to produce the first one-shot pulse in response to a change to a LOW level of the first level-shifted signal corresponding to the stopping of level shift operation by said first level shift circuit unit; and
    a second pulse generating circuit configured to produce the second one-shot pulse in response to a change to a LOW level of the second level-shifted signal corresponding to the stopping of level shift operation by said second level shift circuit unit.

4. The level shift circuit as claimed in claim 3, wherein said first pulse generating circuit includes:
    a first delay circuit configured to delay the first level-shifted signal supplied from said first level shift circuit unit by a predetermined delay time to produce a delayed signal; and
    a first logic circuit configured to receive the first level-shifted signal from said first level shift circuit unit and the delayed signal from said first delay circuit to produce the first one-shot pulse having a pulse width thereof equal to the predetermined delay time of said first delay circuit in response to the change to the LOW level of the first level-shifted signal,
    and wherein said second pulse generating circuit includes:
    a second delay circuit configured to delay the second level-shifted signal supplied from said second level shift circuit unit by a predetermined delay time to produce a delayed signal; and
    a second logic circuit configured to receive the second level-shifted signal from said second level shift circuit unit and the delayed signal from said second delay circuit to produce the second one-shot pulse having a pulse width thereof equal to the predetermined delay time of said second delay circuit in response to the change to the LOW level of the second level-shifted signal.

5. The level shift circuit as claimed in claim 4, wherein said output circuit unit is a RS flip-flop circuit.

6. The level shift circuit as claimed in claim 5, wherein each of said first delay circuit and said second delay circuit includes one or more inverter circuits connected in series, each of said first logic circuit and said second logic circuit being a NAND gate, and said RS flip-flop circuit including NAND gates.

7. The level shift circuit as claimed in claim 5, wherein each of said first delay circuit and said second delay circuit includes one or more inverter circuits connected in series, each of said first logic circuit and said second logic circuit being an AND gate, and said RS flip-flop circuit including NOR gates.

8. The level shift circuit as claimed in claim 6, further comprising:
    a first inverter circuit configured to invert the first level-shifted signal from said first level shift circuit unit for provision to said first delay circuit and said first logic circuit; and
    a second inverter circuit configured to invert the second level-shifted signal from said second level shift circuit unit for provision to said second delay circuit and said second logic circuit,
    wherein a number of said one or more inverter circuits in each of said first delay circuit and said second delay circuit is an odd number.

9. The level shift circuit as claimed in claim 7, further comprising:

a first inverter circuit configured to invert the first level-shifted signal from said first level shift circuit unit for provision to said first delay circuit and said first logic circuit; and a second inverter circuit configured to invert the second level-shifted signal from said second level shift circuit unit for provision to said second delay circuit and said second logic circuit, wherein a number of said one or more inverter circuits in each of said first delay circuit and said second delay circuit is an odd number.

10. The level shift circuit as claimed in claim 1, wherein said first level shift circuit unit includes:

a first series circuit coupled between a positive-side power supply voltage and a negative-side power supply voltage corresponding to the second voltage range, said first series circuit comprising a first P-channel-type transistor operating in response to a voltage level of the second level-shifted signal of said second level shift circuit unit and a first N-channel-type transistor operating in response to said first one of the binary input signals, said first P-channel-type transistor and said first N-channel-type transistor being connected in series; and a second N-channel-type transistor connected in parallel to said first N-channel-type transistor to operate in response to the voltage level of the second level-shifted signal of said second level shift circuit unit, and wherein said second level shift circuit unit includes:

a second series circuit coupled between the positive-side power supply voltage and the negative-side power supply voltage corresponding to the second voltage range, said second series circuit comprising a second P-channel-type transistor operating in response to a voltage level of the first level-shifted signal of said first level shift circuit unit and a third N-channel-type transistor operating in response to said second one of the binary input signals, said second P-channel-type transistor and said third N-channel-type transistor being connected in series; and a fourth N-channel-type transistor connected in parallel to said third N-channel-type transistor to operate in response to the voltage level of the first level-shifted signal of said first level shift circuit unit, wherein said first level shift circuit unit produces the first level-shifted signal at a joint point between said first P-channel-type transistor and said first N-channel-type transistor, and stops level shift operation by turning off said first P-channel-type transistor, and wherein said second level shift circuit unit produces the second level-shifted signal at a joint point between said second P-channel-type transistor and said third N-channel-type transistor, and stops level shift operation by turning off said second P-channel-type transistor.

* * * * *